(12) United States Patent
Lee et al.

(10) Patent No.: US 9,478,768 B2
(45) Date of Patent: Oct. 25, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Min-Woo Lee, Yongin (KR); Young-Mo Koo, Yongin (KR); Jae-Goo Lee, Yongin (KR); Woo-Sik Jeon, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 136 days.

(21) Appl. No.: 13/776,516

(22) Filed: Feb. 25, 2013

(65) Prior Publication Data
US 2014/0138630 A1 May 22, 2014

(30) Foreign Application Priority Data
Nov. 20, 2012 (KR) .................. 10-2012-0131941

(51) Int. Cl.
*H01L 51/52* (2006.01)
*H01L 27/32* (2006.01)

(52) U.S. Cl.
CPC ....... *H01L 51/5253* (2013.01); *H01L 51/5268* (2013.01); *H01L 27/322* (2013.01); *H01L 27/3258* (2013.01); *H01L 51/5275* (2013.01)

(58) Field of Classification Search
CPC ........... H01L 51/5253; H01L 51/5268; H01L 27/332; H01L 57/3258
USPC .......... 438/38, 99; 257/40, E33.001, E33.06, 257/E33.067; 313/506, 498
See application file for complete search history.

(56) References Cited

U.S. PATENT DOCUMENTS

| 7,245,065 | B2 | 7/2007 | Ghosh et al. |
| 7,338,825 | B2 | 3/2008 | Kim et al. |
| 7,362,515 | B2* | 4/2008 | Miyazawa ..................... 359/722 |
| 2003/0011870 | A1* | 1/2003 | Otake ............... G02F 1/133553 359/315 |
| 2003/0122980 | A1 | 7/2003 | Jin et al. |
| 2003/0132896 | A1* | 7/2003 | Matsueda ....................... 345/55 |
| 2003/0164496 | A1* | 9/2003 | Do ...................... H01L 51/5262 257/40 |
| 2003/0218698 | A1* | 11/2003 | Otake .................. G02B 5/0242 349/42 |

(Continued)

FOREIGN PATENT DOCUMENTS

| JP | 2012-158823 A | 8/2012 |
| KR | 10-2003-0057206 A | 7/2003 |

(Continued)

OTHER PUBLICATIONS

Taiwanese Office Action dated Aug. 26, 2016 for Taiwan Patent Application No. 102114732, which shares priority of Korean Patent Application No. KR 10-2012-0131941 with subject U.S. Appl. No. 13/776,516.

*Primary Examiner* — Michele Fan
(74) *Attorney, Agent, or Firm* — Knobbe Martens Olson & Bear LLP

(57) ABSTRACT

In an aspect, an organic light-emitting display apparatus including: a substrate; at least one color filter formed on the substrate; an overcoat layer covering the at least one color filter; a first passivation layer formed on the overcoat layer; a light scattering layer formed on the first passivation layer; a first electrode formed on the light scattering layer; a second electrode facing the first electrode; and an organic layer located between the first and second electrodes is provided.

19 Claims, 6 Drawing Sheets

(56) References Cited

U.S. PATENT DOCUMENTS

| | | | | |
|---|---|---|---|---|
| 2004/0207795 | A1* | 10/2004 | Sakai | G02F 1/136286 349/149 |
| 2005/0024599 | A1* | 2/2005 | Katagami | B41J 2/145 353/84 |
| 2005/0179840 | A1* | 8/2005 | Park | G02F 1/133514 349/114 |
| 2005/0269944 | A1* | 12/2005 | Su | H01L 51/5237 313/504 |
| 2006/0108919 | A1* | 5/2006 | Kobayashi | 313/506 |
| 2006/0163597 | A1* | 7/2006 | Noda | H01L 27/322 257/98 |
| 2006/0215088 | A1* | 9/2006 | Kamijo | G02F 1/133555 349/114 |
| 2007/0075305 | A1* | 4/2007 | Miyata | H01L 27/3211 257/13 |
| 2007/0134516 | A1 | 6/2007 | Kim | |
| 2007/0257608 | A1* | 11/2007 | Tyan et al. | 313/506 |
| 2008/0024402 | A1* | 1/2008 | Nishikawa | H01L 51/5209 345/82 |
| 2008/0169461 | A1* | 7/2008 | Park | H01L 51/5271 257/40 |
| 2008/0278063 | A1* | 11/2008 | Cok | B82Y 20/00 313/500 |
| 2008/0303435 | A1* | 12/2008 | Cok | H01L 51/5284 313/506 |
| 2009/0195152 | A1* | 8/2009 | Sawano | B82Y 20/00 313/504 |
| 2010/0032701 | A1* | 2/2010 | Fudeta | 257/98 |
| 2010/0066651 | A1* | 3/2010 | Lee | H01L 51/5265 345/76 |
| 2010/0124044 | A1* | 5/2010 | Kato | B82Y 10/00 362/97.1 |
| 2010/0124045 | A1* | 5/2010 | Kato | B29C 39/021 362/97.1 |
| 2011/0198629 | A1* | 8/2011 | Lee et al. | 257/89 |
| 2012/0273814 | A1* | 11/2012 | Pan et al. | 257/88 |
| 2013/0015450 | A1* | 1/2013 | Kim | H01L 51/5275 257/59 |
| 2013/0270542 | A1* | 10/2013 | Setz | 257/40 |
| 2014/0312339 | A1* | 10/2014 | Fujita | H01L 27/322 257/40 |

FOREIGN PATENT DOCUMENTS

| | | |
|---|---|---|
| KR | 10-2006-0061633 A | 6/2006 |
| KR | 10-2007-0061013 A | 6/2007 |
| TW | 2006-33579 A | 9/2006 |
| WO | WO2012084630 A1 * | 6/2012 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2012-0131941, filed on Nov. 20, 2012 in the Korean Intellectual Property Office, the disclosure of which is incorporated herein by reference in its entirety.

BACKGROUND

1. Field

The described technology generally relates to an organic light-emitting display apparatus and a method of manufacturing the same, and more particularly, to an organic light-emitting display apparatus including a light scattering layer.

2. Description of the Related Technology

Generally, an organic light-emitting diode (OLED) has a structure wherein an organic light-emitting layer in a thin film shape is located between an anode (positive electrode) and a cathode (negative electrode). The OLED emits light due to holes injected from the anode and electrons injected from the cathode recombining in the organic light-emitting layer.

An OLED may be classified according to driving methods into a passive matrix (PM) type having a passive driving method, and an active matrix (AM) type having an active driving method. In a PM type OLED (PM-OLED), the anodes and the cathodes are respectively arranged in columns and rows and a scan signal may be supplied from a row driving circuit to the cathode, which causes selection of one of the rows. Also, a data signal may be input to each pixel of a column driving circuit. In contrast, an active matrix type OLED (AM-OLED) may control a signal input to each pixel by using a thin film transistor, and an AM-OLED may be used as a display apparatus for applications of displaying a moving image since the AM-OLED is suitable for processing a large amount of signals.

A top-emission type red, green, and blue (RGB) independent deposition method may be used to manufacture an AM-OLED having low power consumption and high bright room contrast ratio (CR) characteristics. According to the RGB independent deposition method, patterning may be configured according to colors by using a minute metal mask. However, it is difficult to control an RGB independent deposition method for a large AM-OLED due to issues with precision while arranging the minute metal masks and also due to a deflection phenomenon generated by using a large mask size. In contrast, an inkjet method, one of methods of forming RGB independent emissive layers, may use a large substrate, but material characteristics need to be pre-obtained since characteristics of a soluble material is currently worse than characteristics of a deposition material. Also, a laser induced thermal imaging (LITI) method that independently transfers an emissive layer formed on a donor film by using laser beam may be used, but a lifespan of the OLED may be low.

A white OLED-color filter (WOLED-CF) method, wherein a color filter is employed for WOLED, has come into the spotlight because of process efficiency and yield rates. The WOLED-CF method uses the color filter for color patterning, and applies an overcoat layer for planarization.

SUMMARY

The present embodiments provide an organic light-emitting display apparatus and a method of manufacturing the same. In some embodiments, the apparatus provides optimized luminance characteristics and light utility efficiency, improved viewing angle, and prevention of light-leaking phenomenon during operation.

Some embodiments provide an organic light-emitting display apparatus including: a substrate; at least one color filter formed on the substrate; an overcoat layer covering the at least one color filter; a first passivation layer formed on the overcoat layer; a light scattering layer formed on the first passivation layer; a first electrode formed on the light scattering layer; a second electrode facing the first electrode; and an organic layer located between the first and second electrodes.

In some embodiments, the organic light-emitting display apparatus may further include a second passivation layer between the light scattering layer and the first electrode.

In some embodiments, the organic light-emitting display apparatus may further include a protection layer located between the substrate and the at least one color filter.

In some embodiments, the at least one color filter may be any one of a red filter, a green filter, and a blue filter.

In some embodiments, the organic light-emitting display apparatus may further include a pixel-define layer composed of a pixel region and a non-pixel region, on the second passivation layer.

In some embodiments, the first and second passivation layers may include a composition including silicon oxide or silicon nitride. In some embodiments, the silicon oxide-based layer may include a composition represented by the formula $SiO_x$, and an x value may be from about 0.1 to about 2. In some embodiments, the silicon oxide-based layer may include a composition represented by formula $SiN_x$, and an x value may be from about 0.1 to about 2.

In some embodiments, a thickness of the light scattering layer may be from 1 nm to 100 nm.

In some embodiments, the light scattering layer may include a high refractive metal oxide.

In some embodiments, the light scattering layer may be formed of at least one material selected from the group consisting of niobium pentoxide ($Nb_2O_5$), zinc oxide (ZnO), copper oxide (CuO), and indium gallium zinc oxide ($InGaZnO_4$).

Some embodiments provide a method of manufacturing an organic light-emitting display apparatus, the method including: providing a substrate; forming at least one color filter on the substrate; forming an overcoat layer covering the color filter; forming a first passivation layer on the overcoat layer; forming a light scattering layer on the first passivation layer; forming a first electrode on the light scattering layer; forming an organic layer on the first electrode; and forming a second electrode on the organic layer.

In some embodiments, the method may further include forming a protection layer on the substrate, between the providing of the substrate and forming of the at least one color filter.

In some embodiments, the method may further include forming a pixel-define layer on the second passivation layer composed of a pixel region and a non-pixel region, after forming the first electrode and before forming the organic layer.

In some embodiments, the forming of the first passivation layer may include forming the first passivation layer by using a silicon oxide-based layer or a silicon nitride-based layer. In some embodiments, the silicon oxide-based layer may include a composition represented by the formula $SiO_x$, and an x value may be from about 0.1 to about 2. In some embodiments, the silicon oxide-based layer may include a composition represented by formula $SiN_x$, and an x value may be from about 0.1 to about 2.

In some embodiments, the forming of the light scattering layer may include forming the light scattering layer to have a thickness from 1 nm to 100 nm.

In some embodiments, the forming of the light scattering layer may include forming the light scattering layer by using a high refractive metal oxide.

In some embodiments, the forming of the light scattering layer may include forming the light scattering layer by using at least one material selected from the group consisting of niobium pentoxide ($Nb_2O_5$), zinc oxide (ZnO), copper oxide (CuO), and indium gallium zinc oxide ($InGaZnO_4$).

In some embodiments, the forming of the light scattering layer may include forming the light scattering layer via a chemical deposition method or a sputtering method.

In some embodiments, the method may further include forming a second passivation layer on the light scattering layer between the forming of the light scattering layer and the forming of the first electrode.

In some embodiments, the second passivation layer may be formed of an SiOx-based layer or an SiNx-based layer.

BRIEF DESCRIPTION OF THE DRAWINGS

The above and other features and advantages of the present embodiments will become more apparent by describing in detail exemplary embodiments thereof with reference to the attached drawings in which:

FIGS. 6A through 6H are cross-sectional views for describing a method of manufacturing an organic light-emitting display apparatus according to another embodiment, which realizes the circuit of FIG. 1, wherein FIG. 6A is a cross-sectional view illustrating a state after a substrate is provided;

FIG. 6B is a cross-sectional view illustrating a state after a protection layer is formed on the substrate of FIG. 6A;

FIG. 6C is a cross-sectional view illustrating a state after at least one color filter is formed on the passivation layer of FIG. 6B;

FIG. 6D is a cross-sectional view illustrating a state after an overcoat layer covering the color filter of FIG. 6C is formed;

FIG. 6E is a cross-sectional view illustrating a state after a first passivation layer is formed on the overcoat layer of FIG. 6D;

FIG. 6F is a cross-sectional view illustrating a state after a light scattering layer is formed on the first passivation layer of FIG. 6E;

FIG. 6G is a cross-sectional view illustrating a state after a second passivation layer is formed on the light scattering layer of FIG. 6F; and FIG. 6H is a cross-sectional view illustrating a state after a pixel-define layer that classifies a pixel region and a non-pixel region, a first electrode, an organic layer, and a second electrode are formed on the second passivation layer of FIG. 6G.

DETAILED DESCRIPTION

Figure 1:
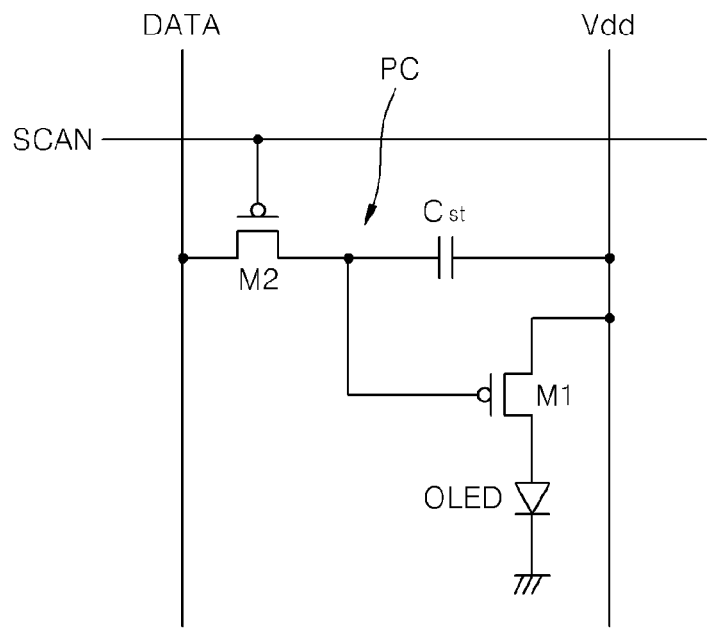
FIG. 1 is a circuit diagram of a pixel circuit of one pixel of an active matrix type organic light-emitting display apparatus, according to an embodiment.

Hereinafter, the present disclosure will be described in more detail with reference to embodiments illustrated in the accompanying drawings. The scope of the present disclosure is not limited to drawings or embodiments described below. Exemplary embodiments to be described below and illustrated in the drawings may include various equivalences and modifications. It will be appreciated that all changes, equivalents, and substitutes that do not depart from the spirit and technical scope of the present disclosure are encompassed in the present embodiments.

While such terms as "first," "second," etc., may be used to describe various components, such components must not be limited to the above terms. The above terms are used only to distinguish one component from another.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments of the present disclosure will be described in detail with reference to accompanying drawings.

FIG. 1 is a circuit diagram of a pixel circuit of one pixel of an active matrix type organic light-emitting display apparatus, according to an embodiment of the present invention.

Referring to FIG. 1, the organic light-emitting display apparatus according to an embodiment is connected to a plurality of signal lines and includes a plurality of pixels arranged in an approximate matrix shape, wherein each pixel includes a pixel circuit PC.

Each pixel includes a data line DATA, a scan line SCAN, and a power supply line Vdd that is a driving power supply of an organic light-emitting diode (OLED). The pixel circuit PC is electrically connected to the data line DATA, the scan line SCAN, and the power supply line Vdd, and controls light-emission of the OLED.

Each pixel includes at least two thin film transistors (TFTs) including a switching TFT M2 and a driving TFT M1, a capacitor unit Cst, and the OLED.

In some embodiments, the switching TFT M2 may be turned on or off by a scan signal applied to the scan line SCAN so as to transfer a data signal applied to the data line DATA to the capacitor unit Cst and the driving TFT M1. A switching device is not limited to the switching TFT M2 of FIG. 1, and may be a switching circuit including a plurality of TFTs and a capacitor, or may further include a circuit for compensating for a Vth value of the driving TFT M1 or a voltage drop of the power supply line Vdd.

In some embodiments, the driving TFT M1 determines an amount of current flowing to the OLED according to the data signal transmitted through the switching TFT M2.

In some embodiments, the capacitor unit Cst stores the data signal transmitted through the switching TFT M2 for one frame.

In FIG. 1, the driving TFT M1 and the switching TFT M2 may be p-channel metal oxide semiconductor (PMOS) TFTs, but alternatively, at least one of the driving TFT M1 and the switching TFT M2 may be an NMOS TFT. Also, the numbers of the TFTs and capacitor units are not limited to the described embodiment, and more numbers thereof may be included.

Figure 2:
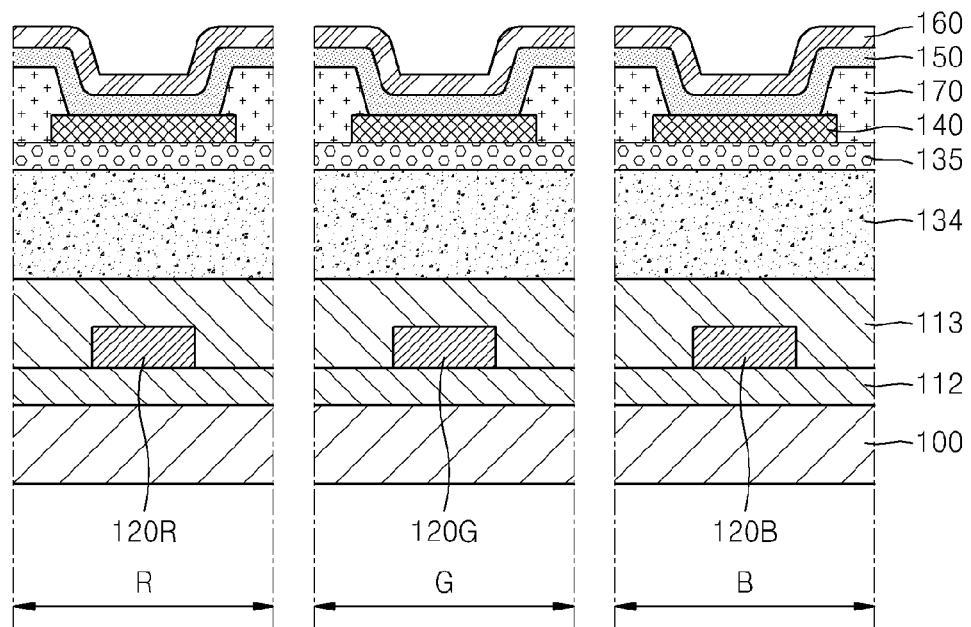
FIG. 2 is a cross-sectional view schematically illustrating three neighboring pixels of an organic light-emitting display apparatus according to an embodiment, which realizes a circuit of FIG. 1.
Figure 3:
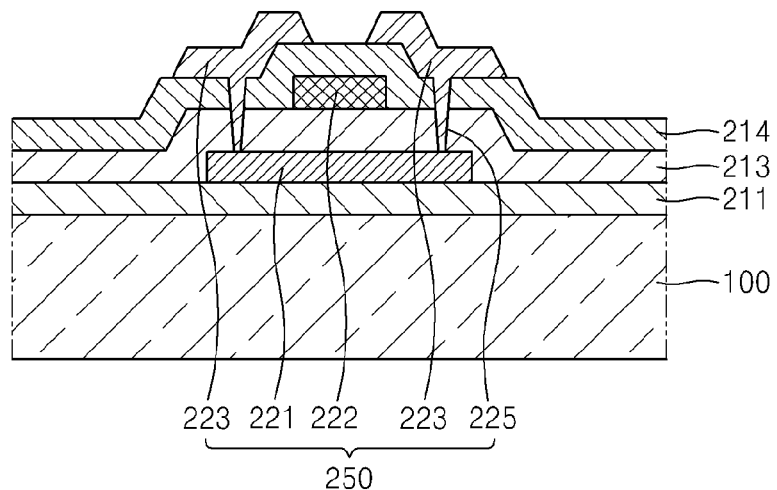
FIG. 3 is a cross-sectional view schematically illustrating a driving circuit of FIG. 2.

FIG. 2 is a cross-sectional view schematically illustrating three neighboring pixels of an organic light-emitting display apparatus according to an embodiment, which realizes a circuit of FIG. 1. FIG. 3 is a cross-sectional view schematically illustrating a driving circuit of FIG. 2.

In some embodiments, the three neighboring pixels including a red pixel R, a green pixel G, and a blue pixel B may be repeated along a row and/or a column, and an arrangement of pixels may vary.

Referring to FIG. 2, the organic light-emitting display apparatus may include the red pixel R, the green pixel G, and the blue pixel B, which are located on a substrate 100. Also, the organic light-emitting display apparatus may include red, green, and blue color filters 120R, 120G, and 120B, which selectively absorb white light emitted from each pixel, according to corresponding pixels.

In some embodiments, the substrate 100 may be a transparent substrate and formed of a glass material mainly including silicon oxide ($SiO_2$). However, the substrate 100 is not limited thereto, and may be formed of plastic or a metal.

In some embodiments, the TFT 250 shown in FIG. 3 may be located on the substrate 100. In some embodiments, a top gate type TFT is illustrated as an example of the TFT 250, but a TFT having another structure may be alternatively employed.

In some embodiments, an insulation layer 211, such as a barrier layer and/or a buffer layer, may be formed on the substrate 100 before forming the TFT 250. In some embodiments, the insulation layer 211 may prevent impurity ions from being diffused, and/or moisture or outside air from penetrating. In some embodiments, the insulation layer 211 may facilitate planarizing a surface. In some embodiments, the insulation layer 211 may be formed of $SiO_2$ and/or silicon nitride (SiNx).

In some embodiments, an active layer 221 of the TFT 250 may be formed on the insulation layer 211 by using a semiconductor material, and a gate insulation film 213 may be formed to cover the active layer 221. In some embodiments, the active layer 221 may be formed of an inorganic semiconductor such as amorphous silicon or poly silicon, or an organic semiconductor, and includes a source region, a drain region, and a channel region therebetween.

In some embodiments, the active layer 221 may be formed of poly silicon, and in this case, a predetermined region may be doped with an impurity. In some embodiments, the active layer 221 may be formed of amorphous silicon instead of poly silicon, or any one of various organic semiconductor materials, such as pentacene.

In some embodiments, the gate insulation film 213 may be used to insulate the active layer 221 and a gate electrode 222 from each other. In some embodiments, the gate insulation film 213 may be formed of an insulation material, such as SiO or SiN, or an insulation organic material.

In some embodiments, the gate electrode 222 may be formed on the gate insulation film 213, and an interlayer insulation film 214 may be formed to cover the gate electrode 222. In some embodiments, a source and drain electrode 223 may be connected to the active layer 221 on the interlayer insulation film 214, through a contact hole 225.

In some embodiments, the gate electrode 222 may be formed of any one of various conductive materials. For example, the gate electrode 222 may be formed of magnesium (Mg), aluminum (Al), nickel (Ni), chromium (Cr), molybdenum (Mo), Tungsten (W), MoW, or gold (Au), and may have a single or multiple players.

In some embodiments, the interlayer insulation film 214 may be formed of an insulation material, such as SiO or SiN, or an insulation organic material. The interlayer insulation film 214 and the gate insulation film 213 may be selectively removed to form the contact hole 225 exposing the source and drain regions. Then, the source and drain electrodes 223 may be formed on the interlayer insulation film 214 in a single or multiple layers by using the material for forming the gate electrode 222, so as to embed the contact hole 225.

In some embodiments, the source and drain electrode 223 of the TFT 250 may be electrically connected to a lower electrode of a pixel.

In some embodiments, the TFT 250 formed as such may be protected by a protection layer 112. In some embodiments, the protection layer 112 may be an inorganic insulation film and/or an organic insulation film. The inorganic insulation film may include SiOx, SiNx, silicon oxynitride (SiON), $Al_2O_3$, titanium oxide ($TiO_2$), tantalum oxide ($Ta_2O_5$), hafnium oxide ($HfO_2$), zirconium oxide ($ZrO_2$), barium strontium titanate (BST), and lead zirconate titanate (PZT), and the organic insulation film may include a general-purpose polymer (polymethyl methacrylate (PMMA) or polystyrene (PS)), a polymer derivative having a phenol group, an acryl-based polymer, an imide-based polymer, an arylether-based polymer, an amide-based polymer, a fluorine-based polymer, a p-xylan-based polymer, a vinylalcohol-based polymer, and a blend thereof. In some embodiments, the protection layer 112 may be formed of a complex stacked structure of an inorganic insulation film and an organic insulation film.

In some embodiments, the red color filter 120R corresponding to the red pixel R, the green color filter 120G corresponding to the green pixel G, and the blue color filter 120B corresponding to the blue pixel B may be located on the protection layer 112. In some embodiments, the red, green, and blue color filters 120R, 120G, and 120B may be formed via patterning after coating.

In some embodiments, the red, green, and blue color filters 120R, 120G, and 120B may be arranged in a color filter on array (COA) method. In some embodiments, the red, green, and blue color filters 120R, 120G, and 120B generate different colored lights by receiving white light from each pixel.

In some embodiments, an overcoat layer 113 for protecting the red, green, and blue color filters 120R, 120G, and 120B and planarizing surfaces of layers where the red, green, and blue color filters 120R, 120G, and 120B are formed may be located on the red, green, and blue color filters 120R, 120G, and 120B. In some embodiments, the overcoat layer 113 may be formed of an inorganic insulation film and/or an organic insulation film. In some embodiments, the inorganic insulation film may include SiOx, SiNx, SiON, $Al_2O_3$, $TiO_2$, $Ta_2O_5$, $HfO_2$, $ZrO_2$, BST, and PZT, and the organic insulation film may include a general-purpose polymer (PMMA or PS), a polymer derivative having a phenol group, an acryl-based polymer, an imide-based polymer, an arylether-based polymer, an amide-based polymer, a fluorine-based polymer, a p-xylan-based polymer, a vinylalcohol-based polymer, and a blend thereof. In some embodiments, the overcoat layer 113 may be formed of a complex stacked structure of an inorganic insulation film and an organic insulation film. In some embodiments, the overcoat layer 113 may be formed of a material having high transmittance considering light-emitting efficiency.

In some embodiments, a first passivation layer 134 may be formed on the overcoat layer 113. In some embodiments, the first passivation layer 134 may be formed via a chemical vapor deposition (CVD) method, a sputtering method, or a coating method. In some embodiments, the first passivation layer 134 may be formed of the same material as the protection layer 112.

In some embodiments, the red, green, and blue color filters 120R, 120G, and 120B and the overcoat layer 113 may be outgassed unlike an inorganic film, and thus a pixel shrinkage phenomenon may be generated due to deterioration of an organic emissive layer. Accordingly, the first passivation layer 134 may be formed on the overcoat layer 113 to prevent outgassing.

In some embodiments, a light scattering layer 135 may be formed on the first passivation layer 134. In some embodiments, the light scattering layer 135 may include a high refractive metal oxide. In some embodiments, the light scattering layer 135 may include at least one material selected from the group consisting of niobium pentoxide ($Nb_2O_5$), zinc oxide (ZnO), copper oxide (CuO), and indium gallium zinc oxide ($InGaZnO_4$).

In some embodiments, the light scattering layer 135 may be formed of a CVD method or a sputtering method.

In some embodiments, in order to connect a first electrode 140 and the source and drain electrode 223 of the TFT 250, the light scattering layer 135 and the first passivation layer 134 may be simultaneously etched, and thus the thickness of the light scattering layer 135 may be from about 1 nm to about 100 nm. If the light scattering layer 135 has the thickness higher than 100 nm, a hole for connecting the first electrode 140 and the source and drain electrode 223 of the TFT 250 may be formed by performing double etching or performing wet-etching and dry-etching in parallel.

As a result, the light scattering layer 135 may be located between the first passivation layer 134 and the first electrode 140, thereby helping light generated by an organic layer 150 to be efficiently emitted. In some embodiments, a luminance characteristic and light utility efficiency of the organic light-emitting display apparatus may optimized by positioning the light scattering layer 135 between the first passivation layer 134 and the first electrode 140. In some embodiments, a viewing angle may be improved by scattering the light generated by the organic layer 150. In some embodiments, a light-leaking phenomenon may be prevented by scattering light leaking outside the red, green, and blue pixels R, G, and B from among light generated by the organic layer 150.

In some embodiments, a pixel-define layer 170 for classifying a pixel region and a non-pixel region may be formed on the light scattering layer 135. In some embodiments, the pixel-define layer 170 may include an opening exposing at least a part of the first electrode 140. In some embodiments, the opening of the pixel-define layer 170 defines an emission region where light is actually generated.

In some embodiments, the red, green, and blue pixels R, G, and B may be formed on the light scattering layer 135 respectively according to the red, green, and blue color filters 120R, 120G, and 120B.

In some embodiments, each of the red, green, and blue pixels R, G, and B include the first electrode 140, the organic layer 150, and a second electrode 160.

In some embodiments, the first electrode 140 may be formed of a conductive material, such as indium tin oxide (ITO), indium zinc oxide (IZO), ZnO, or $In_2O_3$, and in a predetermined pattern according to pixels via a photolithography method. In some embodiments, the first electrode 140 may be electrically connected to the TFT 250 therebelow. In some embodiments, the first electrode 140 may operate as an anode by being connected to an external electrode terminal (not shown).

In some embodiments, the second electrode 160 may be formed on the organic layer 150, according to the position of the first electrode 140. In some embodiments, the second electrode 160 may be a common electrode where the second electrodes 160 of all pixels are commonly bound, by depositing a second conductive material, such as Li, Ca, LiF/Ca, LiF/Al, Al, Ag, Mg, Ba, or a compound thereof, throughout pixels. In some embodiments, the second electrode 160 may operate as a cathode by being connected to an external electrode terminal (not shown).

In some embodiments, polarities of the first and second electrodes 140 and 160 may be switched.

In some embodiments, the organic layer 150 located between the first electrodes 140 and the second electrodes 160 may formed by stacking an emissive layer and at least one of functional layers, such as a hole transport layer (HTL), a hole injection layer (HIL), an electron transport layer (ETL), and an electron injection layer (EIL), in a single or complex structure.

In some embodiments, the organic layer 150 may be formed of a low-molecular weight or high-molecular weight organic material. Examples of the low-molecular weight organic material include copper phthalocyanine (CuPc), N,N'-Di(naphthalene-1-yl)-N,N'-diphenyl-benzidine (NPB), and tris-8-hydroxyquinoline aluminum (Alq3). In some embodiments, a polymer organic layer using the high-molecular weight organic material may be formed via an inkjet printing method or a spin coating method by using poly-(2,4)-ethylene-dihydroxy thiophene (PEDOT) or polyaniline (PANI), and a polymer organic emissive layer may be formed of poly(p-phenylene vinylene (PPV), soluble PPV, cyano-PPV, or polyfluorene.

In some embodiments, the emissive layer may be a stacked type or a tandem type. In some embodiments, the stacked type emissive layer may include red, green, and blue sub-emissive layers, and a stacking order is not specifically limited. In the stacked type emissive layer, all of the red, green, and blue sub-emissive layers may be fluorescent, or at least one of the red, green, and blue sub-emissive layers may be phosphorescent. In the tandem type emissive layer, all of the red, green, and blue sub-emissive layers may be fluorescent, or at least one of the red, green, and blue sub-emissive layers may be phosphorescent. Also in the tandem type emissive layer, emissive layers stacked across a charge generation layer (CGL) may emit white, different colored lights, or the same colored light, wherein the different colored lights or the same colored light may be a single color or many colors.

Structures of sub-emissive layers of pixels may differ from each other, and various colored lights may be combined regardless of red light, green light, and blue light, as long as white light is emitted.

Figure 4:
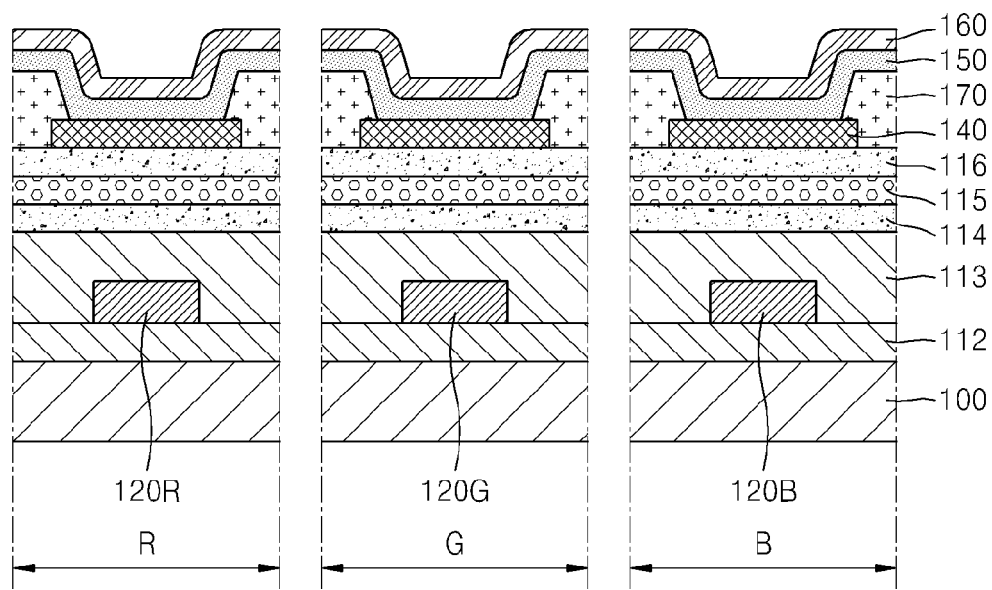
FIG. 4 is a cross-sectional view schematically illustrating three neighboring pixels of an organic light-emitting display apparatus according to another embodiment, which realizes the circuit of FIG. 1.

FIG. 4 is a cross-sectional view schematically illustrating three neighboring pixels of an organic light-emitting display apparatus according to another embodiment, which realizes the circuit of FIG. 1. Details about the organic light-emitting display apparatus of FIG. 4, which are same as the organic light-emitting display apparatus of FIG. 2 will not be repeated.

Referring to FIG. 4, a second passivation layer 116 may be located between a light scattering layer 115 and the first electrode 140.

In some embodiments, the second passivation layer 116 may be formed of the same material as a first passivation layer 114.

In some embodiments, the red, green, and blue color filters 120R, 120G, and 120B, and the overcoat layer 113 are outgassed in materials unlike an inorganic film, and thus a pixel shrinkage phenomenon is generated due to deterioration of an organic emissive layer. In some embodiments, the second passivation layer 116 may be additionally formed on the light scattering layer 115 so as to form double passivation layers, i.e., the first and second passivation layers 114 and 116, thereby further effectively blocking the outgas generated in the red, green, and blue color filters 120R, 120G, and 120B, and the overcoat layer 113. Thus, the pixel shrinkage phenomenon due to the deterioration of the organic emissive layer may be prevented.

Figure 5:
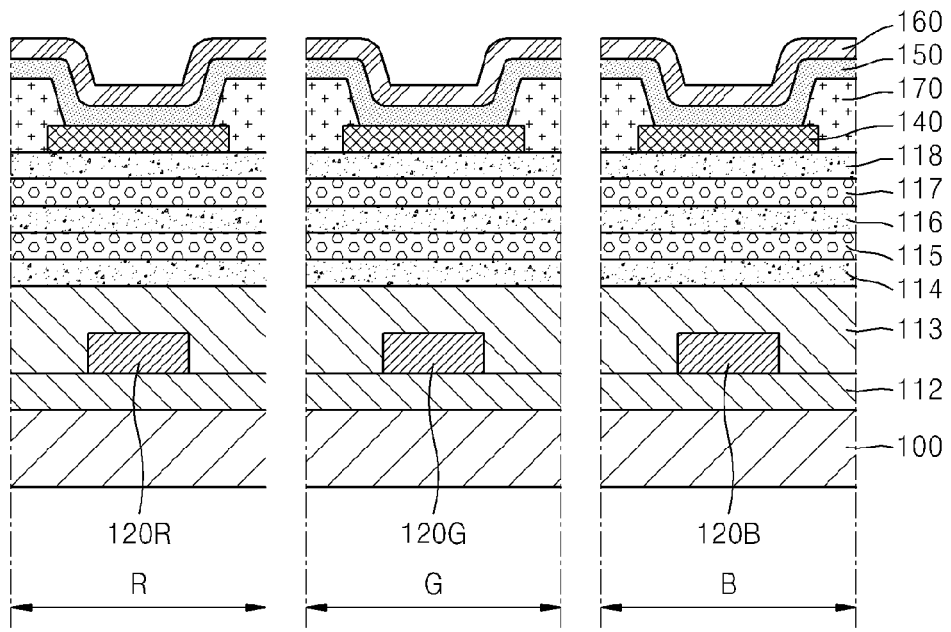
FIG. 5 is a cross-sectional view schematically illustrating three neighboring pixels of an organic light-emitting display apparatus according to another embodiment, which realizes the circuit of FIG. 1.

FIG. 5 is a cross-sectional view schematically illustrating three neighboring red, green, and blue pixels R, G, and B of an organic light-emitting display apparatus according to another embodiment, which realizes the circuit of FIG. 1. Details about the organic light-emitting display apparatus of FIG. 5, which are same as those of the organic light-emitting display apparatus of FIG. 2 will not be repeated.

Referring to FIG. 5, passivation layers 114, 116, and 118, and light scattering layers 115 and 117 are alternatively stacked on each other, such that there are three passivation layers 114, 116, and 118, and two light scattering layers 115 and 117.

However, the stacking structure of the passivation layers 114, 116, and 118, and the light scattering layers 115 and 117 of the organic light-emitting display apparatus is not limited thereto, and may vary.

The organic light-emitting display apparatuses of FIGS. 2, 4, and 5 described above are bottom emission types wherein lights are emitted toward the substrate 100, but alternatively, they may be top emission types. In this case, a lower electrode of each pixel may be a reflective electrode and an upper electrode may be a transparent electrode. In some embodiments, a color filter corresponding to each pixel may be stacked on the transparent electrode or formed on a separate substrate.

FIGS. 6A through 6H are cross-sectional views for describing a method of manufacturing an organic light-emitting display apparatus according to another embodiment, which realizes the circuit of FIG. 1.

Figure 6A:
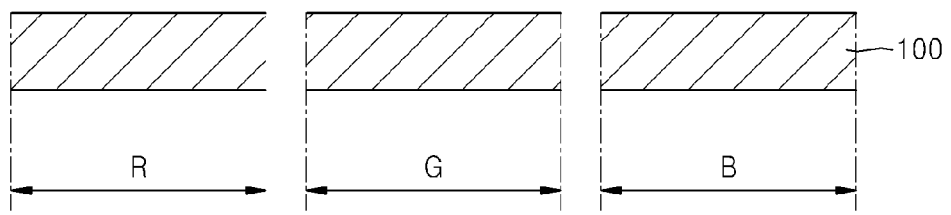
Figure 6B:
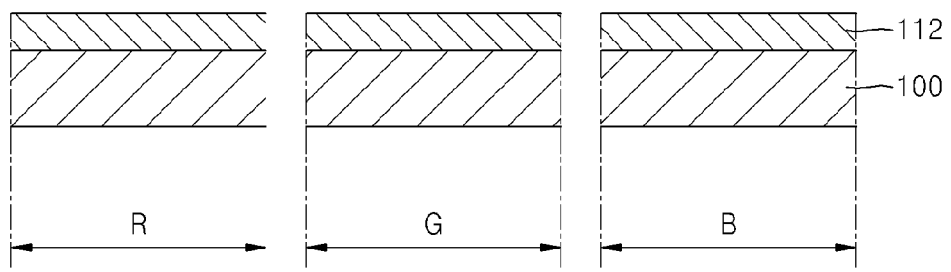

Referring to FIG. 6A, the substrate 100 is provided.

Referring to FIG. 6, the protection layer 112 is formed on the substrate 100. In some embodiments, the protection layer 112 may be formed of a composition including SiOx or SiNx.

Figure 6C:
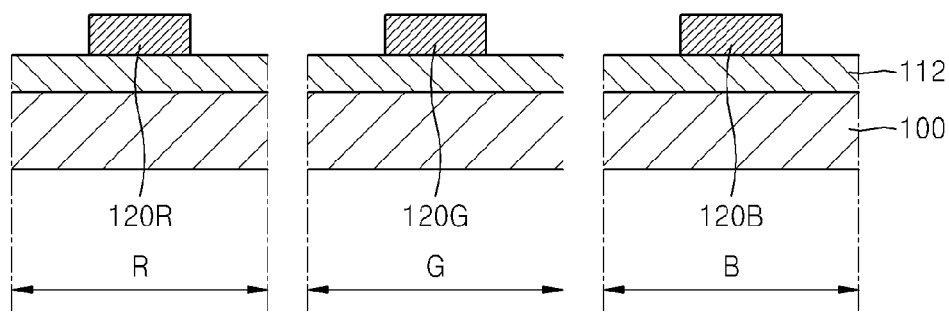

Referring to FIG. 6C, at least one of the red, green, and blue color filters 120R, 120G, and 120B may be formed on the protection layer 112.

Figure 6D:
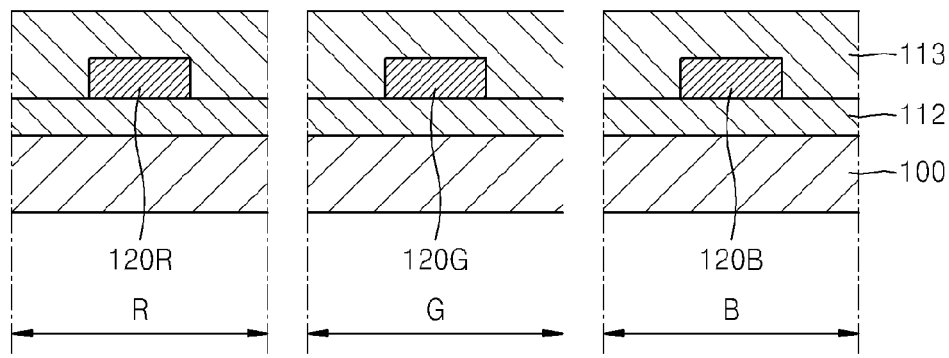

Referring to FIG. 6D, an overcoat layer 113 covering the red, green, and blue color filters 120R, 120G, and 120B may be formed.

Figure 6E:
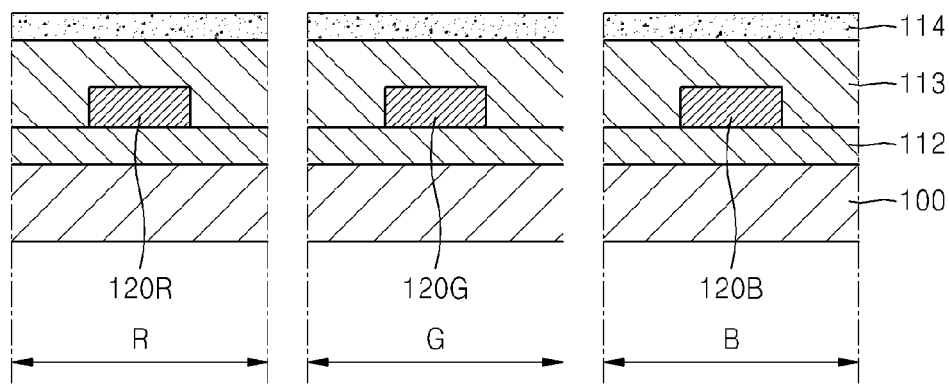

Referring to FIG. 6E, a first passivation layer 114 may be formed on the overcoat layer 113. In some embodiments, the first passivation layer 114 may include a composition represented by the formula SiOx or formula SiNx.

Figure 6F:
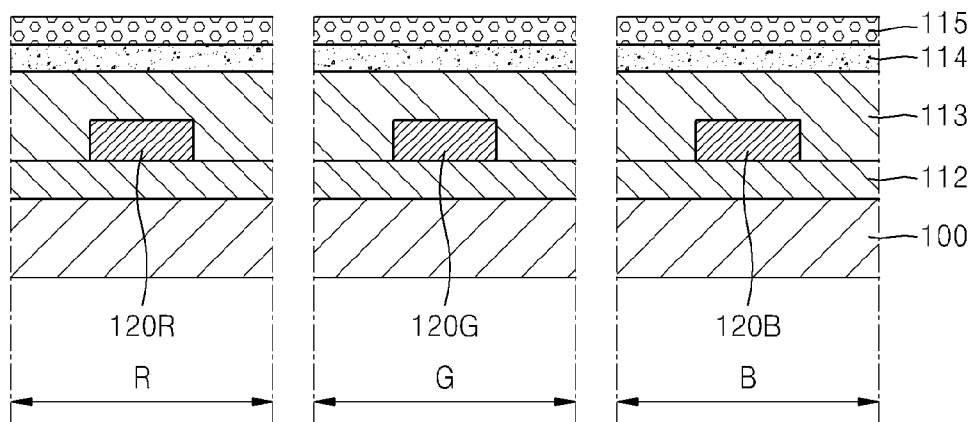

Referring to FIG. 6F, the light scattering layer 115 may be formed on the first passivation layer 114. In some embodiments, the light scattering layer 115 may include a high refractive metal oxide. In some embodiments, the light scattering layer 115 may include at least one material selected from the group consisting of $Nb_2O_5$, ZnO, CuO, and $InGaZnO_4$. In some embodiments, the light scattering layer 135 may be formed via a CVD method or a sputtering method. In some embodiments, the light scattering layer 115 and the first passivation layer 114 need to be simultaneously etched in order to connect the first electrode 140 and the source and drain electrode 223 of the TFT 250 of FIG. 3. In some embodiments, the thickness of the light scattering layer 115 may be from about 1 nm to about 100 nm. By forming the light scattering layer 115 on the first passivation layer 114, a light extracting efficiency and a viewing angle may be improved, and a light-leaking phenomenon may be prevented.

Figure 6G:
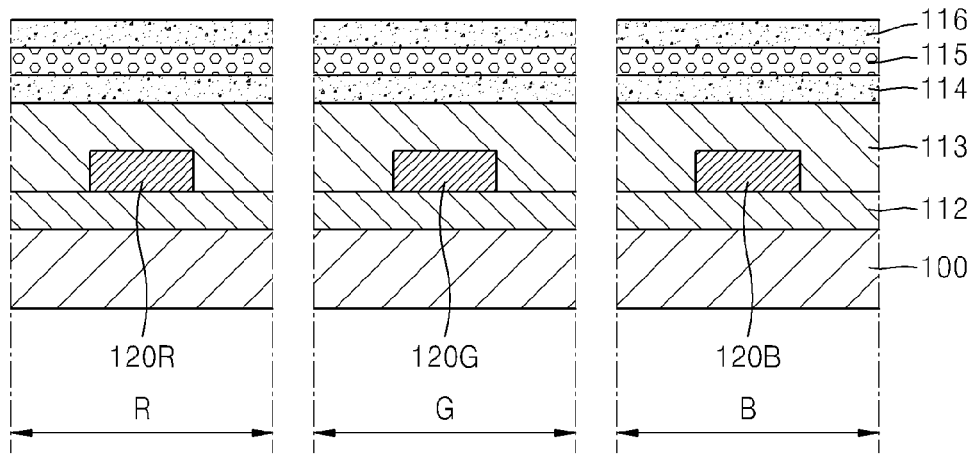

Referring to FIG. 6G, the second passivation layer 116 may be formed on the light scattering layer 115. In some embodiments, the second passivation layer 116 may include a composition represented by the formula SiOx or formula SiNx. Since there are two passivation layers, i.e., the first and second passivation layers 115 and 116, outgases generated in the red, green, and blue color filters 120R, 120G, and 120B, respectively, and the overcoat layer 113 are further effectively blocked, and thus a pixel shrinkage phenomenon due to deterioration of an organic emission layer may be prevented.

Figure 6H:
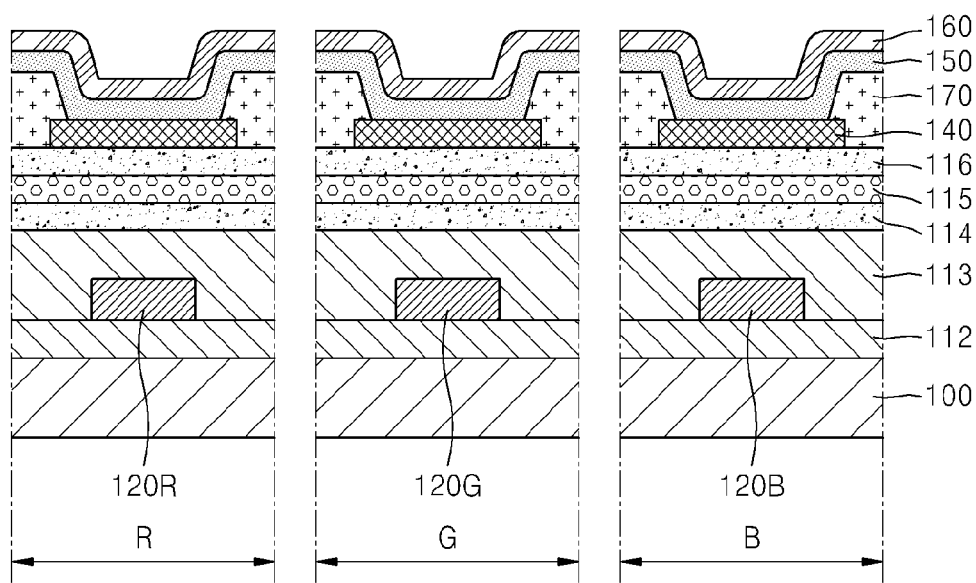

Referring to FIG. 6H, the pixel-define layer 170, the first electrode 140, the organic layer 150, and the second electrode 160 may be formed on the second passivation layer 116. In some embodiments, the, the pixel-define layer 170 may be formed on the second passivation layer 116 after the first electrode 140 is formed on the second passivation layer 116 so as to classify a pixel region and a non-pixel region. In some embodiments, the, the organic layer 150 may be formed on the first electrode 140, and the second electrode 160 may be formed on the organic layer 150.

Some embodiments provide an organic light-emitting display apparatus including a light scattering layer. Accordingly, an image quality may be improved by improving a light extracting efficiency and a viewing angle. Also, reliability of a product may be improved by preventing a light-leaking phenomenon.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting display apparatus comprising:
    a substrate;
    at least one color filter formed on the substrate;
    an overcoat layer covering and directly contacted with the at least one color filter;
    a first passivation layer including inorganic material formed on the overcoat layer, and directly contacted with the overcoat layer;
    a light scattering layer formed on the first passivation layer and directly contacted with the first passivation layer, wherein the light scattering layer is a single layer and scatters light incident on the light scattering layer;
    a first electrode formed on the light scattering layer and directly contacted with the light scattering layer;
    a second electrode facing the first electrode; and
    an organic layer located between the first and second electrodes.

2. The organic light-emitting display apparatus of claim 1, further comprising a second passivation layer between the light scattering layer and the first electrode.

3. The organic light-emitting display apparatus of claim 2, further comprising a pixel-define layer composed of a pixel region and a non-pixel region, on the second passivation layer.

4. The organic light-emitting display apparatus of claim 2, wherein the first and second passivation layers comprise a composition including silicon oxide (SiOx) or silicon nitride (SiNx) where x is from about 0.1 to about 2.

5. The organic light-emitting display apparatus of claim 2, wherein the thickness of the light scattering layer is from 1 nm to 100 nm.

6. The organic light-emitting display apparatus of claim 2, wherein the light scattering layer comprises a high refractive metal oxide.

7. The organic light-emitting display apparatus of claim 6, wherein the light scattering layer is formed of at least one material selected from the group consisting of niobium pentoxide ($Nb_2O_5$), zinc oxide (ZnO), copper oxide (CuO), and indium gallium zinc oxide ($InGaZnO_4$).

8. The organic light-emitting display apparatus of claim 1, further comprising a protection layer located between the substrate and the at least one color filter.

9. The organic light-emitting display apparatus of claim 1, wherein the at least one color filter is any one of a red filter, a green filter, and a blue filter.

10. A method of manufacturing an organic light-emitting display apparatus, the method comprising:
    providing a substrate;
    forming at least one color filter on the substrate;
    forming an overcoat layer covering and directly contacting the color filter;
    forming a first passivation layer directly on the overcoat layer;
    forming a light scattering layer on the first passivation layer to contact directly with the first passivation layer, wherein the light scattering layer is a single layer and scatters light incident on the light scattering layer;
    forming a first electrode on the light scattering layer and directly contacting the light scattering layer;
    forming an organic layer on the first electrode; and
    forming a second electrode on the organic layer.

11. The method of claim 10, further comprising forming a protection layer on the substrate, after the providing of the substrate and before forming of the at least one color filter.

12. The method of claim 10, further comprising forming a pixel-define layer on the light scattering layer, after forming the first electrode and before forming the organic layer.

13. The method of claim 10, wherein the forming of the first passivation layer comprises forming the first passivation layer by using a composition comprising silicon oxide (SiOx) or silicon nitride (SiNx) where x is from about 0.1 to about 2.

14. The method of claim 10, wherein the light scattering layer is formed having a thickness from 1 nm to 100 nm.

15. The method of claim 10, wherein the forming of the light scattering layer comprises using a high refractive metal oxide.

16. The method of claim 15, wherein the forming of the light scattering layer comprises using at least one material selected from the group consisting of niobium pentoxide ($Nb_2O_5$), zinc oxide (ZnO), copper oxide (CuO), and indium gallium zinc oxide ($InGaZnO_4$).

17. The method of claim 10, wherein the forming of the light scattering layer comprises a chemical deposition method or a sputtering method.

18. The method of claim 10, further comprising forming a second passivation layer on the light scattering layer after forming the light scattering layer and before forming the first electrode.

19. The method of claim 18, wherein the second passivation layer comprises a composition represented by formula SiOx or formula SiNx where x is from about 0.1 to about 2.

* * * * *